United States Patent
Comstock et al.

(10) Patent No.: US 6,970,663 B2
(45) Date of Patent: Nov. 29, 2005

(54) SYSTEM AND METHOD OF IMAGE FORMATION ON SPECIALTY MEDIA BY ALTERING INTERPAGE TRANSFER VOLTAGE OR CURRENT

(75) Inventors: Matthew C. Comstock, Lexington, KY (US); Pramod K. Sharma, Lexington, KY (US)

(73) Assignee: LExmark International, Inc., Lexington, KY (US)

( * ) Notice: Subject to any disclaimer, the term of this patent is extended or adjusted under 35 U.S.C. 154(b) by 0 days.

(21) Appl. No.: 10/962,896

(22) Filed: Oct. 12, 2004

(65) Prior Publication Data

US 2005/0063723 A1    Mar. 24, 2005

(51) Int. Cl.[7] .............................. G03G 15/16
(52) U.S. Cl. .................... 399/66; 399/45; 399/389; 399/390
(58) Field of Search ............... 399/45, 66, 389, 399/390

(56) References Cited

U.S. PATENT DOCUMENTS

| | | | |
|---|---|---|---|
| 5,697,015 A | 12/1997 | Ream et al. | |
| 5,884,121 A | 3/1999 | Kyung | |
| 5,903,798 A | 5/1999 | Yokogawa et al. | |
| 5,905,925 A * | 5/1999 | Kawabata et al. | 399/45 |
| 5,999,760 A * | 12/1999 | Suzuki et al. | 399/45 |
| 6,009,286 A * | 12/1999 | Watanabe et al. | 399/44 |
| 6,381,425 B2 | 4/2002 | Sasai | |
| 6,438,333 B1 * | 8/2002 | Katsumi et al. | 399/66 |
| 6,477,339 B1 * | 11/2002 | Yano et al. | 399/66 |
| 6,633,736 B1 | 10/2003 | Park | |
| 6,701,101 B2 | 3/2004 | Ahn | |
| 2003/0156851 A1 * | 8/2003 | Koh et al. | 399/45 |

* cited by examiner

*Primary Examiner*—Arthur T. Grimley
*Assistant Examiner*—Peter Lee
(74) *Attorney, Agent, or Firm*—Coats & Bennett, PLLC

(57) ABSTRACT

An image forming device prints on specialty media comprising a first and second area having different media properties. The device prints on the first area at a first transfer voltage level selected in response to a media property of the first area. The device prints on the second area at a second transfer voltage level selected in response to a media property of the second area. The device changes from the first transfer voltage level to the second transfer voltage level when a predetermined location on the specialty media, on which no image is formed, is within the transfer nip.

30 Claims, 4 Drawing Sheets

SYSTEM AND METHOD OF IMAGE FORMATION ON SPECIALTY MEDIA BY ALTERING INTERPAGE TRANSFER VOLTAGE OR CURRENT

BACKGROUND

The present invention relates generally to the field of image forming devices and in particular to an image forming device that improves print quality when printing on specialty media comprising printing areas having different properties, by altering the transfer voltage when printing to the different areas.

As known in the art, one factor in achieving acceptable image quality on a media sheet is the transfer voltage applied to transfer a toner image from a toner image carrier (such as a photoconductor unit or an intermediate transfer belt) to the media sheet. In particular, it is known to vary the transfer voltage to achieve acceptable image quality for different types of media sheets based on the properties of the media. For example, a higher transfer voltage may be required to achieve acceptable image quality when transferring images to label media comprising removable, stick-on labels adhered to a backing, than is required to achieve acceptable image quality when transferring images to plain paper media sheets. Similarly, transparencies, envelopes, and other media types may each require a unique transfer voltage to achieve acceptable image quality.

While the transfer voltage may be altered based on media type—whether automatically sensed or input via a user input panel—achieving acceptable quality when printing to specialty media that combine one or more media types remains problematic.

SUMMARY

In one aspect, the present invention relates to a method of forming an image on a media sheet having at least two distinct areas, the areas exhibiting different media properties, by an image forming device having at least one transfer nip wherein a developed image is transferred to the media sheet by applying a transfer voltage. A first image is formed on the media sheet in the first area at a first transfer voltage selected in response to a media property of the first area. The first transfer voltage is changed to a second transfer voltage when a predetermined location on the media sheet is within the transfer nip. A second image is then formed on the media sheet in the second area at the second transfer voltage, the second transfer voltage selected in response to a media property of the second area.

In another aspect, the present invention relates to an image forming device for forming an image on a media sheet having at least two distinct areas, the areas exhibiting different media properties. The image forming device includes a toner image carrier, a transfer member having a variable transfer voltage, and a transfer nip formed between the toner image carrier and the transfer member. The nip is operative to receive a media sheet and to transfer an image from the toner image carrier to the media sheet in response to the toner voltage. The image forming device further includes a controller operative to set the transfer member to a first transfer voltage when a first area of the media sheet is in the nip, the first transfer voltage selected in response to a media property of the first area. The controller is also operative to set the transfer member to a different second transfer voltage when a second area of the media sheet is in the nip, the second transfer voltage selected in response to a media property of the second area. Additionally, the controller is operative to change the transfer member from the first voltage to the second voltage when a predetermined location on the media sheet is within the transfer nip.

In yet another aspect, the present invention relates to a method of forming an image on a media sheet having at least two distinct areas, the areas exhibiting different media properties, by an image forming device having at least one transfer nip wherein a developed image is transferred to the media sheet by applying a transfer current. A first image is formed on the media sheet in the first area at a first transfer current selected in response to a media property of the first area. The first transfer current is changed to a second transfer current when a predetermined location on the media sheet is within the transfer nip. A second image is then formed on the media sheet in the second area at the second transfer current, the second transfer current selected in response to a media property of the second area.

DETAILED DESCRIPTION

Figure 1:
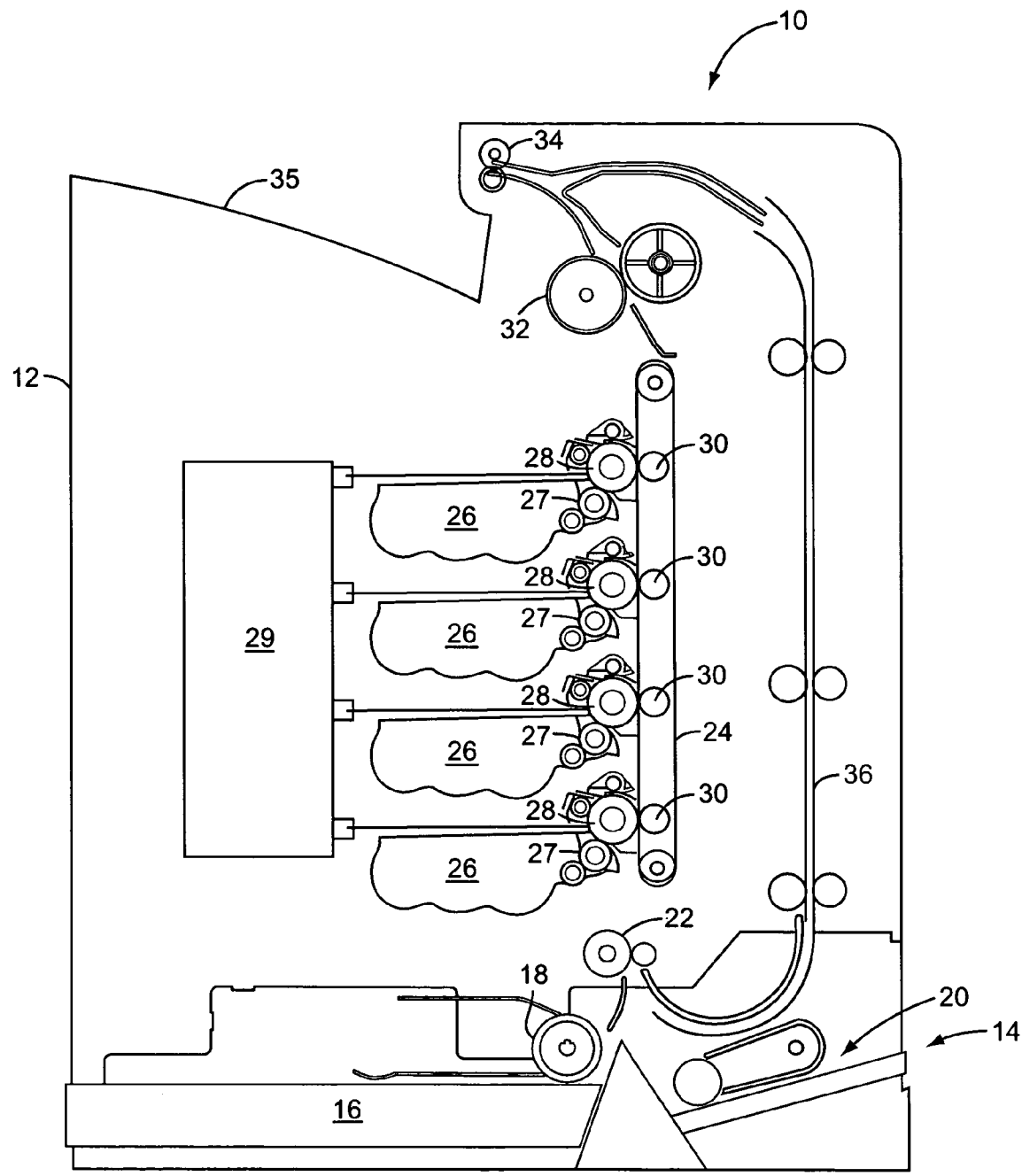
FIG. 1 is a functional block diagram of a direct-transfer image forming device.

FIG. 1 depicts a representative direct-transfer image forming device, indicated generally by the numeral 10. The image forming device 10 comprises a housing 12 and a media tray 14. The media tray 14 includes a main media sheet stack 16 with a sheet pick mechanism 18, and a multipurpose tray 20 for feeding envelopes, transparencies and the like. The media tray 14 may be removable for refilling, and located in a lower section of the device 10.

Within the image forming device body 12, the image forming device 10 includes media registration roller 22, a media sheet transport belt 24, one or more removable developer cartridges 26, photoconductor units 28, developer rollers 27 and corresponding transfer rollers 30, an imaging device 29, a fuser 32, reversible exit rollers 34, and a duplex media sheet path 36, as well as various additional rollers, actuators, sensors, optics, and electronics (not shown) as are conventionally known in the image forming device arts, and which are not further explicated herein. Additionally, the image forming device 10 includes one or more controllers, microprocessors, DSPs, or other stored-program processors (not shown) and associated computer memory, data transfer circuits, and/or other peripherals (not shown) that provide overall control of the image formation process.

Each developer cartridge 26 includes a reservoir of toner and a developer roller 27, in addition to various rollers, paddles and other elements (not shown). Each developer roller 27 is adjacent to a corresponding photoconductor unit 28, with the developer roller 27 developing a latent image on the surface of the photoconductor unit 28 by supplying toner. In various alternative embodiments, the photoconductor unit 28 may be integrated into the developer cartridge 26, may be fixed in the image forming device body 12, or may be disposed in a removable photoconductor cartridge (not shown). In a typical color image forming device, three or four colors of toner—cyan, yellow, magenta, and optionally black—are applied successively (and not necessarily in that order) to a print media sheet to create a color image. Correspondingly, FIG. 1 depicts four sets of developer cartridges 26, photoconductor units 28 and transfer rollers 30. In a monochrome printer, only one such set may be present.

The operation of the image forming device 10 is conventionally known. Upon command from control electronics, a single media sheet is "picked," or selected, from either the primary media stack 16 or the multipurpose tray 20. Alternatively, a media sheet may travel through the duplex path 36 for a two-sided print operation. Regardless of its source, the media sheet is presented at the nip of registration roller 22, which aligns the media sheet and precisely times its passage on to the image forming stations downstream. The media sheet then contacts the transport belt 24, which carries the media sheet successively past the photoconductor units 28. At each photoconductor unit 28, a latent image is formed thereon by optical projection from the imaging device 29. The latent image is developed by applying toner to the photoconductive unit 28 from the corresponding developer roller 27. The toner is subsequently deposited on the media sheet as it is conveyed past the photoconductor unit 28 by operation of a transfer voltage applied by the transfer roller 30. Each color is layered onto the media sheet to form a composite image, as the media sheet passes by each successive photoconductive unit 28.

The toner is thermally fused to the media sheet by the fuser 32, and the sheet then passes through reversible exit rollers 34, to land facedown in the output stack 35 formed on the exterior of the image forming device body 12. Alternatively, the exit rollers 34 may reverse motion after the trailing edge of the media sheet has passed the entrance to the duplex path 36, directing the media sheet through the duplex path 36 for the printing of another image on the back side thereof, or forming additional images on the same side.

Figure 2:
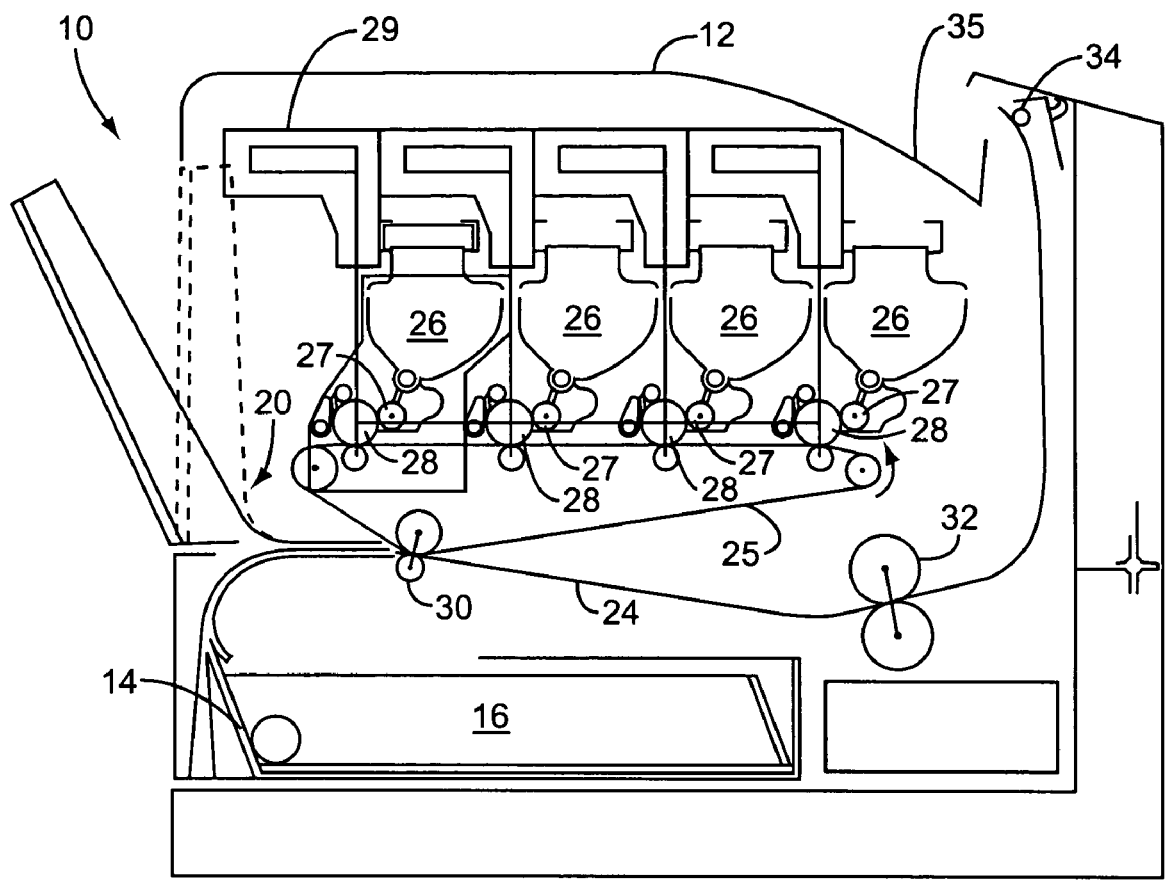
FIG. 2 is functional block diagram of an intermediate-transfer image forming device.

FIG. 2 depicts an alternative configuration of image forming device 10, wherein functional components are numbered consistently with FIG. 1. In this embodiment, toner images are transferred from photoconductor units 28 to an Intermediate Transfer Mechanism (ITM), such as belt 25. A composite toner image is then transferred from the ITM belt 25 to a media sheet moving along the media path 24 by a transfer voltage applied by the transfer roller 30. As used herein, the term "toner image carrier" refers to the photoconductor units 28 in a direct transfer system such as FIG. 1, and an ITM belt 25 in an indirect transfer system such as FIG. 2. That is, the toner image carrier carries a toner image and transfers it to a media sheet. Similarly, as used herein, the term "transfer nip" may refer to the nip between a photoconductor unit 28 and a transfer roller 30 in the case of a direct transfer system such as FIG. 1, or the nip between an ITM belt 25 and a transfer roller 30 in an indirect transfer system such as FIG. 2.

Figure 3:
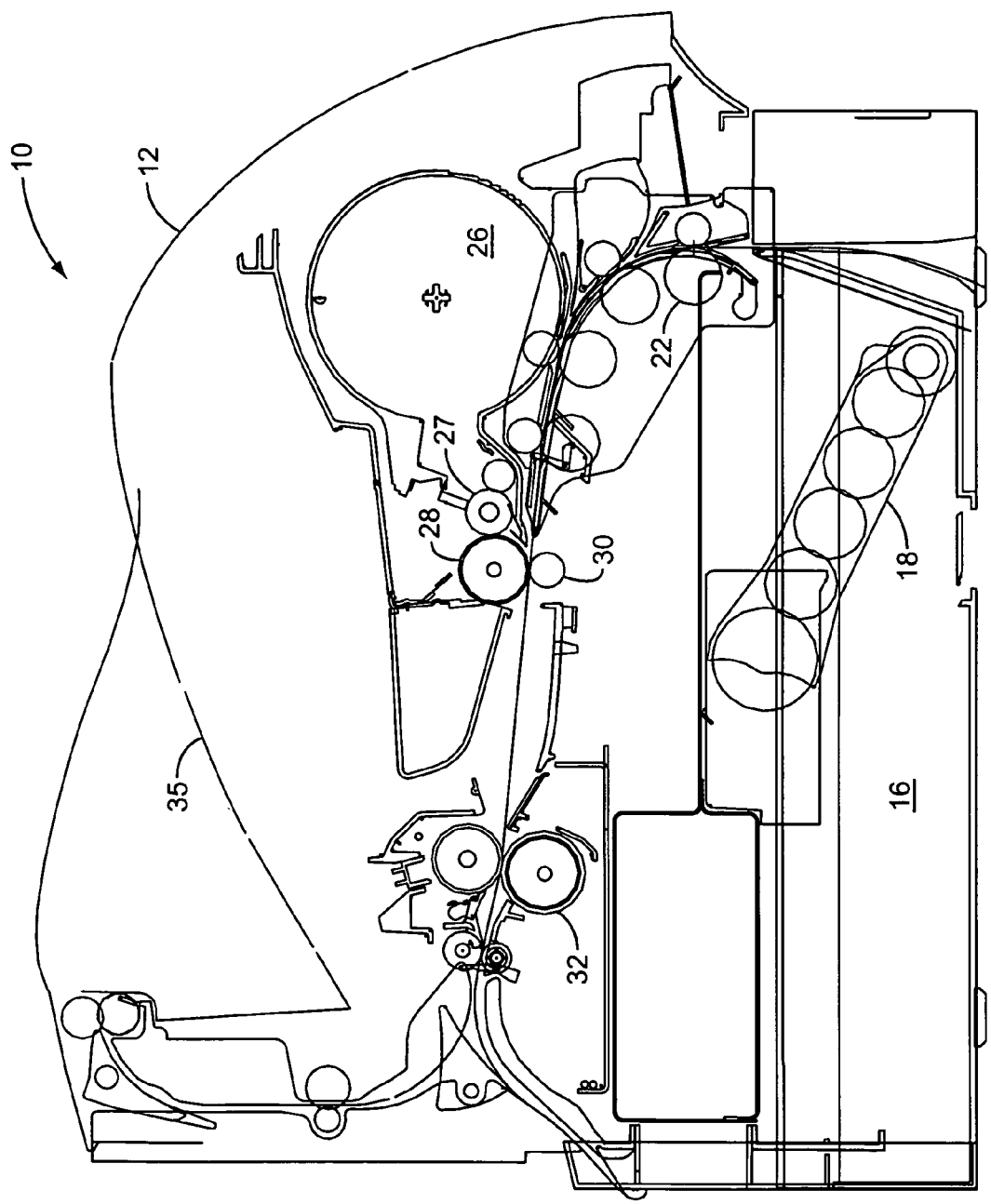
FIG. 3 is a functional block diagram of a monochrome image forming device.

FIG. 3 depicts a monochrome image forming device 10, having a single image transfer station comprising a photoconductor unit 28 and transfer roller 30. In this device 10, a developed image is transferred from the photoconductor unit 28 directly to a media sheet, which is fed directly through the transfer nip. In the image forming device of FIG. 3, both the photoconductor unit 28 and the transfer roller 30 directly contact the media sheet. Otherwise, the operation of the image forming device 10 is directly analogous to that described above with reference to the image forming device 10 of FIG. 1.

As known in the art and as more fully discussed herein, the level of the transfer voltage applied by the transfer roller 30 affects print quality, and is partially dependent upon properties of the media sheet being printed. Some relevant media properties include the thickness of the media sheets; how many layers or plies are in each media sheet; the width of the media sheets; the media type (e.g., transparency, plain paper, label, or the like); for a given media type, the texture of the sheet surface, and the like. Image quality is also highly dependent on other factors, such as environmental factors (temperature, humidity and the like), the age of the image forming device and/or of the transfer roller 30, the composition of the transfer roller 30, and the like. However, for a given media sheet at a given time, these factors are accounted for, and properties of the media sheet are the determining factors in image quality. Some of these media properties may be automatically sensed, such as sensing between plain paper and transparencies via one or more optical sensors. Alternatively, the media type may be input to the image forming device, such as via an operator panel or along with the image from an attached computer or network.

Figure 4:
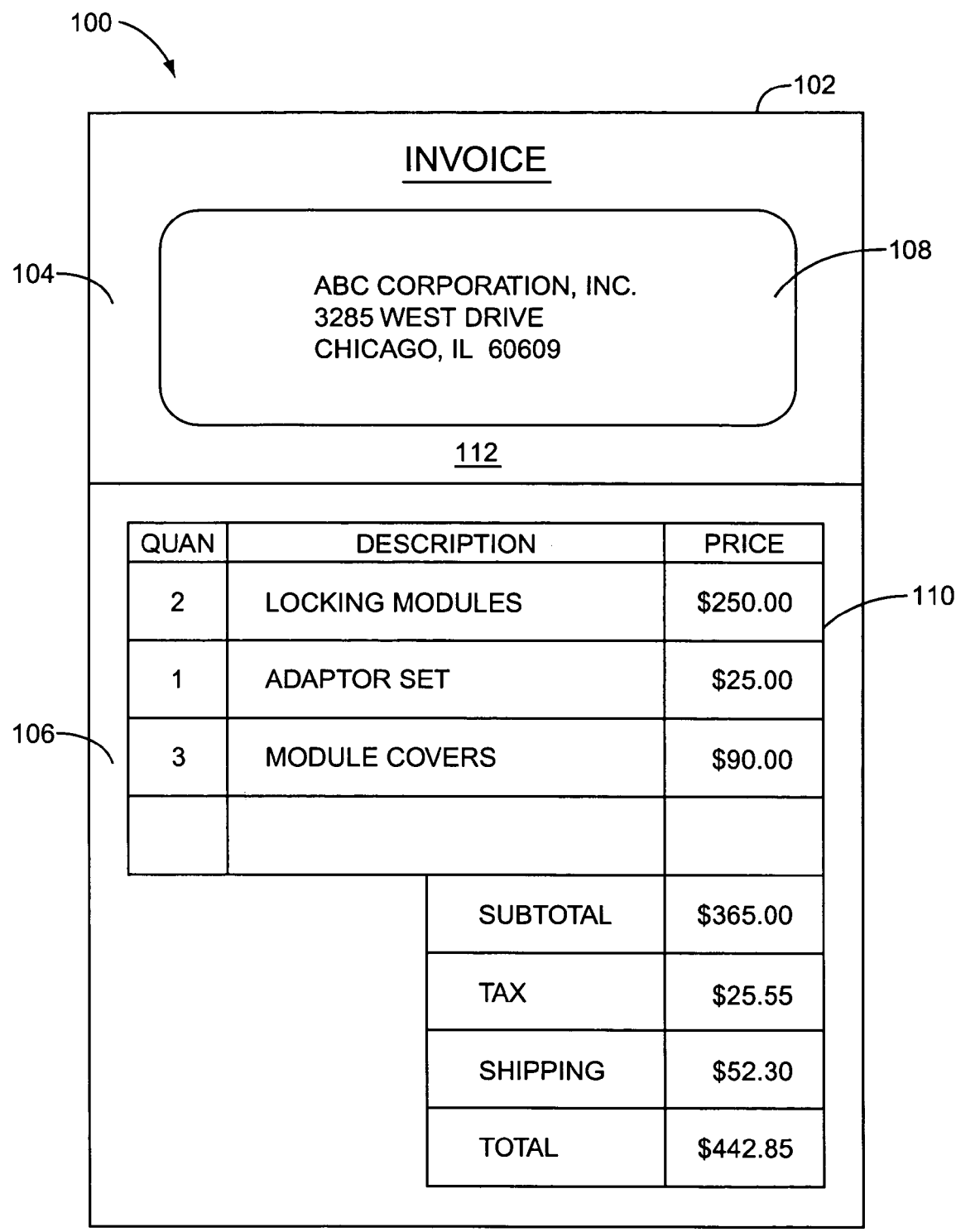
FIG. 4 is a specialty media sheet comprising a label area and a plain paper area.

FIG. 4 depicts one example of a specialty media, indicated generally by the numeral 100. The specialty media 100 comprises a media sheet 102 having two distinct areas—a first area 104 and a second area 106. The areas 104, 106 exhibit different media properties. In particular, the first area 104 comprises a label type media. That is, the first area 104 comprises two layers of material: an upper layer on which an image is formed, the upper layer having an adhesive backing, and a lower, or backing layer. A removable label 108, such as an address label, may be precut in the upper layer of the first area 104 of the specialty media sheet 102. The second area 106 of the specialty media sheet 102 comprises a plain paper media sheet, on which an image such as the detailed invoice 110 may be printed.

In use, such specialty media 100 may find utility, for example, in the shipping department of a company. The specialty media 100 allows both an address label 108 and an invoice 110 specific to a particular order to be printed on the same specialty media sheet 102. The address label 108 may then be removed and affixed to the exterior of a shipping container, and the remaining specialty media sheet 102, including the printed invoice 110, inserted within the shipping container, along with the merchandise. In this manner, the shipping label and invoice need not be printed separately, thus streamlining operations and obviating one source of error—shipping labels and invoices for disparate orders being erroneously interchanged. As with other media types, identification of the specialty media 100 may occur via input to an operator panel, transmission from an attached computer or network, or other method as known in the art.

Under prior art image forming methods, the entire specialty media sheet 102 would be printed using the same transfer voltage, even though it is well known that the label media area 104 requires a higher transfer voltage for acceptable image quality than does the plain paper area 106. According to the present invention, the transfer voltage applied by the transfer roller 30 to transfer an image from an image carrying device to a specialty media sheet 102 is altered from a first voltage used to transfer an image to the first area 104 (the first voltage being selected in response to the media properties of the first area 104) to a second voltage, different from the first voltage, used to transfer the image to the second area 106 (the second voltage being selected in response to the media properties of the second area 106), referred to herein as an intra-page transfer voltage alteration.

Such an intra-page transfer voltage alteration may produce a visible image defect on the specialty media sheet 102 at the point at which the transfer voltage is altered. This defect may manifest itself as either an excessive deposit of toner (dark line) or alternatively as a deficit of toner in an image area including toner (white line). To obviate such potential image defect, according to the present invention, the change in transfer voltage from the first to the second transfer voltage level occurs when a predetermined position of the media sheet 102, on which no image is printed, is located in the transfer roller 30 nip. Changing the transfer voltage level when no image is being printed obviates the possibility of an image defect due to the intra-page change in transfer voltage.

As shown in FIG. 4, the specialty media sheet 102 includes a predetermined position 112 below the shipping label 108 and proximate the transition between the first area 104 and the second area 106. The predetermined position 112 is a position on the media sheet 102 on which no image is formed (i.e., on which nothing is printed). Ideally, each specialty media 100 is designed to include a predetermined position 112, proximate the transition between a first area 104 and the second area 106, on which no image is formed. Note that the predetermined position may fall within the first area 104, as depicted in FIG. 4, or alternatively may fall within the second area 106. In either event, the predetermined position 112 may be input to the image forming device via an operator panel, or transferred to the image forming device from an attached computer or network. The predetermined position 112 may be specified in any applicable manner, such as for example a distance from the leading edge of the media sheet 102. The predetermined position 112 may be stored in memory in the image formation device, to be recalled and used to time the intra-page transfer voltage alteration automatically upon identification of the media sheet 102 as being a specialty media 100.

According to another embodiment of the present invention, where specialty media 100 do not include a predetermined position 112 wherein no image is formed, the transfer voltage level applied by the transfer roller 30 may be altered at a predetermined position (preferably proximate the transition between the first area 104 and the second area 106) with a low toner density. The predetermined position of low toner density image may be known and communicated to the image forming device, such as via an operator panel or from an attached computer or network. Alternatively, the image data for each media sheet 102 may be dynamically analyzed by a print engine or processor in the image forming device, an appropriate low toner density area identified, and the transfer voltage altered at the identified position.

In another embodiment of the present invention, where a predetermined location 112 having no image formed thereon does not exist, the image forming device may enter reduced speed mode for printing the media sheet 102. That is, the entire printing process—from picking the media sheet 102 from a stack to fixing the developed image and delivering the page at an output—may be performed at a reduced speed. When printing at a reduced speed, less of the media sheet 102 passes a given point, such as the transfer nip, in a given time duration. Hence, the power supply settling time when transitioning the transfer voltage from the value used to form images in the first area 104 to the value used to form images in the second area 106 spans a smaller portion of the media sheet 102. This may obviate or minimize visible image defects due to the intra-page transfer voltage alteration. In another embodiment, the power supply in the image forming device may be transitioned between the two transfer voltages in such a way as to obviate or minimize an image quality defect due to the intra-page transfer voltage alteration.

In some cases, altering the transfer voltage may be insufficient to achieve acceptable image quality in both the first area 104 and second area 106 of media sheets 102. According to another embodiment of the present invention, the speed of the media sheet 102 may be altered from a first speed used to form an image in the first area 104 (the first speed selected in response to a media property of the first area 104) to a second speed, different from the first speed, used to form an image in the second area 106 (the second speed selected in response to a media property of the second area 104). Note that the transfer voltage level and the speed of the media sheet 102 through the transfer nip may be independently altered between the first area 104 and the second area 106, to achieve acceptable image quality.

The transfer voltage applied to transfer an image from a toner image carrier to a media sheet is one of the few print image quality factors that can be altered late in production, or even when the image forming device is deployed in the field. In contrast, changes in toner formulation, photoconductor unit surface properties, imaging optics and the like require extensive system redesign if the parameters are altered. However, implementing an intra-page transfer voltage alteration for specialty media 100 may often be accomplished by merely altering the image forming device software, often stored in flash memory, facilitating such changes. Additionally, typically only certain image forming devices will need to be programmed to print to specialty media 100, and the details of specialty media 100, such as the location of the predetermined location 112 on which no image is formed, will vary according to the application. According to the present invention, software, which may be added to existing image forming devices, is operative to cause the devices to print to specialty media 100, by printing to a first area 104 using a first transfer voltage, and printing to a second area 106 using a second transfer voltage. In particular, the software may identify a predetermined position 112 proximate the transition between the first area 104 and the second are 106, on which no image is formed. The software may be loaded into flash memory on existing image forming devices, for example from a CD via an attached computer or across a network from a disk or other computer-readable medium.

Although the present invention is described herein with reference to a specialty media 100 having two areas 104 and 106 exhibiting different media properties, the present invention is equally applicable to media having three, four, or more such areas. The transfer voltage may be altered intra-page as often as necessary to achieve acceptable image quality in each area of the media sheet. Where predetermined positions at or near the transition between such areas where no image is formed, the transfer voltage may be altered at such predetermined areas. The overall printing speed of such media sheets may be reduced, and/or each different area of the media sheet may be printed at a different speed, as well as, or in lieu of, printing it at a different transfer voltage.

According to another embodiment of the present invention, the transfer voltage may be altered while printing a single media sheet according to the image density. Low toner density image areas typically require a lower transfer voltage to achieve acceptable image quality; higher toner density image areas require a higher transfer voltage to achieve acceptable image quality. Thus, the transfer voltage may be altered between two or more values in response to the toner density of the image being printed. The designation of high toner density image areas, requiring a higher transfer voltage and low toner density image areas, requiring a lower transfer voltage, may be predetermined, such as in the case of printing known images such as certain forms, letters, tables, and the like. Alternatively, the different toner density image areas may be dynamically determined ("on the fly"), such as by analysis by a processor or controller within the image forming device.

The present invention has been explicated herein with reference to a "constant transfer voltage" type of image forming device, wherein, in the prior art, the transfer voltage is maintained at a constant level throughout the image transfer process. Another type of image forming device known in the art is a "constant transfer current" type, wherein the current to the transfer device is maintained at a constant level throughout the image transfer process. The present invention is equally applicable to constant transfer current type devices. That is, a first transfer current may be applied to a first area of a specialty media sheet having first media properties, and a different second transfer current applied to a second area of the sheet having second media properties, to achieve acceptable image quality in both media sheet areas. All other embodiments and aspects of the present invention disclosed herein are equally applicable to constant transfer current type image forming methods and devices.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of forming an image on a specialty media sheet having at least two distinct areas, said areas exhibiting different media properties, by an image forming device having at least one transfer nip wherein a developed image is transferred to said specialty media by applying a transfer voltage, comprising:
   forming a first toner image on said media sheet in said first area at a first transfer voltage selected in response to a media property of said first area;
   changing from said first transfer voltage to a different second transfer voltage while said media sheet remains within said transfer nip; and
   forming a second toner image on said media sheet in said second area at said second transfer voltage, said second transfer voltage selected in response to a media property of said second area.

2. The method of claim 1 wherein changing from said first transfer voltage to a second transfer voltage occurs when a predetermined location on said media sheet is within said transfer nip.

3. The method of claim 2 wherein said predetermined location comprises a location proximate a transition between said first and second areas.

4. The method of claim 3 wherein no image is formed on said media sheet at said predetermined location.

5. The method of claim 3 further comprising forming a low toner density image said media sheet at said predetermined location.

6. The method of claim 1 wherein one of said first and second areas comprises paper, and wherein the other of said first and second areas comprises a label.

7. The method of claim 1 further comprising reducing a speed at which said media sheet passes through said transfer nip prior to changing from said first transfer voltage to said second transfer voltage.

8. The method of claim 1 further comprising forming said first image in said first area at a first speed of said media sheet through said transfer nip, and forming said second image in said second area at a second speed of said media sheet through said transfer nip.

9. The method of claim 8 wherein said first speed is selected in response to a media property of said first area and said second speed is selected in response to a media property of said second area.

10. The method of claim 1 wherein at least one of said first and second images comprise two or more colors, each color of the image(s) transferred to said media sheet at a different transfer nip, and wherein, at each said transfer nip, said first image is transferred to said first area at said first transfer voltage and said second image is transferred to said second area at said second transfer voltage.

11. An image forming device for forming an image on a media sheet comprising at least two distinct areas, said areas exhibiting different media properties, comprising:
   a toner image carrier;
   a transfer member having a variable transfer voltage;
   a transfer nip formed between said toner image carrier and said transfer member, said nip operative to receive a media sheet and to transfer an image from said toner image carrier to said media sheet in response to said toner voltage;
   a controller operative to set said transfer member to a first transfer voltage when a first area of said media sheet is in said nip, said first transfer voltage selected in response to a media property of said first area, and to set said transfer member to a different second transfer voltage while said media sheet remains in said nip and when a second area of said media sheet is in said nip, said second transfer voltage selected in response to a media property of said second area.

12. The image forming device of claim 11 wherein said controller is further operative to change said transfer member from said first voltage to said second voltage when a predetermined location on said media sheet is within said transfer nip.

13. The image forming device of claim 11 wherein said controller is further operative to direct said media sheet through said transfer nip at a first speed selected in response to a media property of said first area when forming an image on said first area, and to direct said media sheet through said transfer nip at a second speed selected in response to a media property of said second area when forming an image on said second area.

14. A computer-readable medium that stores computer-executable process steps for forming an image on a media sheet having at least two distinct areas, said areas exhibiting different media properties, by an image forming device having at least one transfer nip wherein a developed image is transferred to said media sheet by applying a transfer voltage, said computer-executable process steps causing a controller in said image forming device to perform the steps of:
   forming a first image on said media sheet in said first area at a first transfer voltage selected in response to a media property of said first area;

changing from said first transfer voltage to a different second transfer voltage while said media sheet remains within said transfer nip; and forming a second image on said media sheet in said second area at said second transfer voltage, said second transfer voltage selected in response to a media property of said second area.

15. The computer-readable medium of claim 14, said computer-executable process steps further causing said controller to perform the step of changing from said first transfer voltage to said second transfer voltage when a predetermined location on said media sheet is within said transfer nip.

16. The computer-readable medium of claim 14, said computer-executable process steps further causing said controller to perform the step of reducing a speed at which said media sheet passes through said transfer nip prior to changing from said first transfer voltage to a second transfer voltage.

17. The computer-readable medium of claim 14, said computer-executable process steps further causing said controller to perform the steps of forming said first image in said first area at a first speed of said media sheet through said transfer nip, and forming said second image in said second area at a second speed of said media sheet through said transfer nip.

18. The computer-readable medium of claim 17 wherein said first speed is selected in response to a media property of said first area and said second speed is selected in response to a media property of said second area.

19. A method of forming an image on a media sheet, the image comprising at least two areas having different toner densities, by an image forming device having at least one transfer nip wherein a developed image is transferred to said media sheet by applying a transfer voltage, comprising:

forming a first image area on said media sheet at a first transfer voltage selected in response to the toner density of said first image area;

changing from said first transfer voltage to a different second transfer voltage; and forming a second image area on said media sheet at a second transfer voltage selected in response to the toner density of said second image area.

20. The method of claim 19 wherein said first and second image areas are predetermined.

21. The method of claim 19 wherein said first and second image areas are dynamically determined by an analysis of the image.

22. The method of claim 19 wherein changing from said first transfer voltage to a second transfer voltage occurs when a predetermined location on said media sheet is within said transfer nip.

23. The method of claim 22 wherein no image is formed on said specialty media at said predetermined location.

24. The method of claim 22 wherein a low toner density image is formed on said specialty media at said predetermined location.

25. A method of forming an image on a media sheet, comprising:

developing a first section of the media sheet by applying a first transfer voltage at a transfer roller to transfer a first toner image from a toner image carrier to the media sheet;

determining a second section of the media sheet that has at least one different media property than the first section;

executing an intra-page transfer voltage alteration by applying a second transfer voltage different than the first transfer voltage to the transfer roller; and developing the second section of the media sheet by applying the second transfer voltage, the second transfer voltage transferring a second toner image from the toner image carrier to the media sheet.

26. The method of claim 25 wherein detecting a second section of the media sheet that has at least one different media property than the first section comprises receiving information identifying the media sheet and a predetermined location indicative of a transition between the first and second sections of the media sheet.

27. The method of claim 26 further comprising changing the transfer voltage from the first value to the second value when the predetermined location is within a nip between the transfer roller and the toner image carrier.

28. The method of claim 27 wherein no image is formed on the media sheet at the predetermined location.

29. A method of forming an image on a specialty media sheet having at least two distinct areas, said areas exhibiting different media properties, by an image forming device having at least one transfer nip wherein a developed image is transferred to said specialty media by applying a transfer current, comprising:

forming a first toner image on said media sheet in said first area at a first transfer current selected in response to a media property of said first area;

changing from said first transfer current to a different second transfer current while said media sheet remains within said transfer nip; and forming a second toner image on said media sheet in said second area at said second transfer current, said second transfer current selected in response to a media property of said second area.

30. The method of claim 1 wherein changing from said first transfer current to a second transfer current occurs when a predetermined location on said media sheet is within said transfer nip.

* * * * *